(12) United States Patent
McArthur et al.

(10) Patent No.: US 6,356,345 B1
(45) Date of Patent: Mar. 12, 2002

(54) IN-SITU SOURCE METROLOGY INSTRUMENT AND METHOD OF USE

(75) Inventors: Bruce B. McArthur; Adlai H. Smith, both of San Diego, CA (US)

(73) Assignee: Litel Instruments, San Diego, CA (US)

( * ) Notice: Subject to any disclaimer, the term of this patent is extended or adjusted under 35 U.S.C. 154(b) by 0 days.

(21) Appl. No.: 09/247,446

(22) Filed: Feb. 10, 1999

Related U.S. Application Data

(60) Provisional application No. 60/074,285, filed on Feb. 11, 1998.

(51) Int. Cl.[7] .................................................. G01J 1/00
(52) U.S. Cl. ....................................... 356/121; 356/401
(58) Field of Search ................................ 356/124, 355, 356/399, 400, 401, 354, 345, 353, 121, 122; 355/53, 66, 67, 57; 250/348; 430/325, 326, 331

(56) References Cited

U.S. PATENT DOCUMENTS

| | | | |
|---|---|---|---|
| 3,819,265 A | | 6/1974 | Feldman et al. |
| 4,861,148 A | | 8/1989 | Sato et al. |
| 4,943,733 A | * | 7/1990 | Mori et al. .................. 356/401 |
| 5,136,413 A | | 8/1992 | Macdonald et al. |
| 5,285,236 A | | 2/1994 | Jain |
| 5,386,319 A | | 1/1995 | Whitney |
| 5,392,119 A | | 2/1995 | McArthur et al. |
| 5,640,233 A | * | 6/1997 | McArthur et al. .......... 356/124 |
| 5,666,206 A | * | 9/1997 | Uchiyama .................. 356/401 |
| 5,828,455 A | | 10/1998 | Smith et al. |
| 5,929,991 A | | 7/1999 | McArthur et al. |
| 5,978,085 A | | 11/1999 | Smith et al. |
| 6,040,894 A | * | 3/2000 | Takahashi .................. 356/53 |

FOREIGN PATENT DOCUMENTS

| | | | | |
|---|---|---|---|---|
| JP | 0210627 | * | 9/1986 | .................. 356/213 |

OTHER PUBLICATIONS

J. Kirk et al., "Pinholes and pupil fills", *Microlithography World*, vol. 6, No. 4, p. 25, (Autumn 1997).

(List continued on next page.)

*Primary Examiner*—Hoa Q. Pham
(74) *Attorney, Agent, or Firm*—Townsend and Townsend and Crew LLP

(57) ABSTRACT

A device, method of measurement and method of data analysis are described for imaging and quantifying in a practice sense the luminous intensity of the effective illumination source of an image system. The device, called a source metrology instrument, produces images and other quantitative measurements of the combined condenser and light source that are taken in-situ and without any significant alteration of the optical or mechanical set up. As such, the device can be used to monitor and assess the coherence properties of the illumination source with a minimum of interruptions to the optical tools productive time. It can be used with photolithographic step and repeat reduction or nonreducing imaging systems (steppers), scanning image systems, fixed field step and repeat aberration systems, scanning aberration systems, or any other projection imaging or aberration systems.

22 Claims, 18 Drawing Sheets-

AS = APERTURE STOP
OP = OBJECT PLANE OR RETICLE PLANE
IP = IMAGE PLANE OR WAFER PLANE
FP = FOCAL PLANE OR IN FOCUS OUTPUT PLANE
L1 = LENS GROUP 1
L2 = LENS GROUP 2   CO = CONDENSER
LA = LIGHT SOURCE
OA = OPTICAL AXIS

OTHER PUBLICATIONS

Y. Borodovsky, "Impact of Local Partial Coherence Variations on Exposure Tool Performance," *Optical/Laser Microlithography VIII*, SPIE V.1440, p. 750 (Feb. 1995).

D.W. Peters, The effects of an incorrect condenser setup on reduction lens printing capabilities, Interface 85, *Kodak Publ. No. G–154*, pp. 66–72 (1985).

T.F. Hansan et al., "Automated electrical measurements of registration errors in step and repeat optical litography systems," *IEEE Transactions on Electron Devices*, vol. ED027, #12 (Dec. 1980).

L.J. Zych et al., "Electrical Methods for Precision Stepper Column Optimization," *SPIE Optical Lithography V.*, vol, 633, p. 98 (Mar. 1986).

M. Dusa et al., "In–house characterization technique for steppers," *Optical/Laser Microlithography II* (1989), SPIE vol 1088, p. 220 (1989).

J.W. Gemmink, "A simple and calibratable method for the determination of optimal focus," *Optical/Laser Microlithography II* (1989), SPIE vol. 1088, p. 220 (1989).

J.P. Kirk, "Astigmatism and field curvature from pin–bars," *Optical/Laser Microlithography IV*, SPIE vol. 1463, p. 678 (Mar. 6, 1991).

Y. Yoshitake et al., "Multispot Scanning Exposure System for Excimer Laser Stepper," *Optical/Laser Microlithography*, SPIE vol. 1463, p 678 (Mar. 6, 1991).

Z. Yudong et al., "A new family of 1:1 catadioptric broadband deep UV high NA lithography lenses," *Optical/Laser Microlitography IV*, SPIE vol. 1463, p. 688 (Mar. 6, 1991).

M.A. van den Brink et al., "New 0.54 Aperture i–line wafer stepper with field by field leveling combined with global alignment," *Optical/Laser Microlitography IV*, SPIE vol. 1463, p. 709(Mar. 6, 1991).

R. Unger et al., "New i–line and deep–UV optical wager steppers," *Optical/Laser Microlitography IV*, SPIE vol. 1463, p. 725 (Mar. 6, 1991).

T.A. Brunner et al., "Quantitative stepper metrology using the focus monitor test mask", *Optical/Laser Microlitography VII*, SPIE vol. 2197, p 541, (Mar. 2, 1994).

C. Huang, In–situ optimization of an i–line optical projection lens, *Optical/Laser Microlitography VIII*, SPIE vol. 2440, p. 735 (Feb. 22, 1995).

K. Freischlad et al., "A dual–wavelength interferometer for testing projection lenses," *Optical/Laser Microlitography VIII*, SPIE vol. 2440, p. 743 (Feb. 22, 1995).

E. Glatzel, "New lenses for microlitography," *1980 International Lens Design Conference (OSA)*, SPIE vol. 237, p. 310 (1980).

A.R. Phillips et al., "High resolution lens system for sub-micron photolithography," *1980 International Lens Design Conference (OSA)*, SPIE vol. 237, p. 329 (1980).

D.S. Goodman et al., "Condenser Aberrations in Köhler Illumination," *Optical/Laser Microlitography*, SPIE vol. 922 p. 108 (1988).

W. H. Arnold et al., "Wafer steppers for the 64M and 256MBit Memory Generations," *Proceedings of BACUS conference*, SPIE Critical Reviews of Optical Science and Technology, vol. CR51, p. 42 (Sep. 24, 1993).

N.M. Cegilo et al., "Soft x–ray projection litography," *J. Vac. Sci. Technology B*, vol. 8, #6, p. 1325 (Nov./Dec. 1990).

V.K. Viswanathan et al., "Development of Reflective Optical Systems for XUV Projection Litography," *OSA Proceedings on Soft–X–Ray Projection Litography*, vol. 12, p. 30 (1991).

E. Kouno et al., "An x–ray stepper for synchrotron radiation lithography," *J. Vac. Sci. Technology B*, vol. 6, #6, p. 2135 (Nov./Dec. 1988).

* cited by examiner

AS = APERTURE STOP
OP = OBJECT PLANE OR RETICLE PLANE
IP = IMAGE PLANE OR WAFER PLANE
FP = FOCAL PLANE OR IN FOCUS OUTPUT PLANE
L1 = LENS GROUP 1
L2 = LENS GROUP 2    CO = CONDENSER
LA = LIGHT SOURCE
OA = OPTICAL AXIS

P1, P2 = POINTS IN RETICLE PLANE
P1', P2' = CONJUGATE POINTS IN WAFER OR IMAGE PLANE

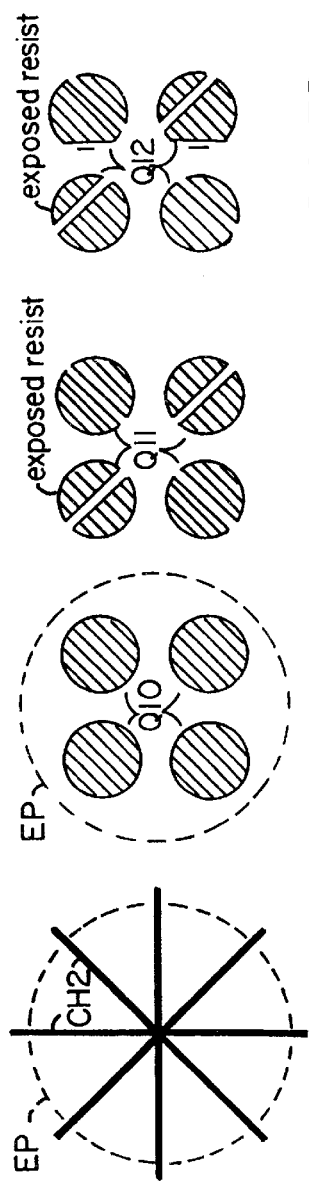

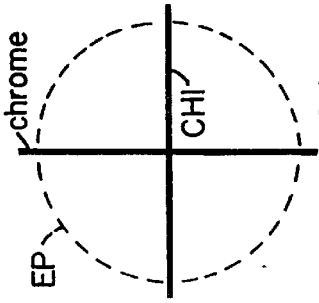

EP = BOUNDARY OF EXIT PUPIL  FIG. 6A.
CH1, CH2 = CROSS HAIRS IN OBJECT PLANE.
AI0 = ANNULAR ILLUMINATION PATTERN IN RELATION TO EXIP PUPIL EP.
AI1 = ANNULAR ILLUMINATION PATTERN AS PROJECTED ONTO WAFER THROUGH PINHOLE CAMERA AND CROSSHAIRS, CONDENSER ALIGNED AT THIS FIELD POINT.
AI2 = COMBINED CROSS HAIR AND SOURCE MAP FOR A MISALIGNED CONDENSER.
QI0 = QUADRUPLE ILLUMINATION PATTERN IN RELATION TO EXIT PUPIL EP.
QI1 = QUADRUPLE ILLUMINATION AS PROJECTED THROUGH CH2 AND PINHOLE ONTO WAFER. CONDENSER IS ALIGNED AT THIS FIELD POINT.
QI2 = QUADRUPLE ILLUMINATION AS PROJECTED THROUGH CH2 AND PINHOLE ONTO WAFER. CONDENSER IS MISALIGNED AT THIS FIELD POINT.

EP = BOUNDARY OF EXIT PUPIL
RP = RETICLE PATTERN (CHROME PART CENTERED AT FIELD POINT

EP = BOUNDARY OF EXIT PUPIL
EPx,y = AXES CENTERED ON EP
RP = RETICLE PATTERN (IMAGE)
CI2 = CONVENTIONAL ILLUMINATION PATTERN WITH MISALIGNED CONDENSER AS PROJECTED ONTO WAFER THRU PINHOLE CAMERA AND RP
CIc = CENTER OF CI2

EP = BOUNDARY OF EXIT PUPIL
EPx,y = AXES CENTERED ON EP
CDR = ONE OF FOUR REGIONS TO MAKE CD MEASUREMENTS
CI2 = CONVENTIONAL ILLUMINATION PATTERN WITH MISALIGNED CONDENSER AS PROJECTED ONTO WAFER THRU PINHOLE CAMERA AND RP
CIc = CENTER OF CI2

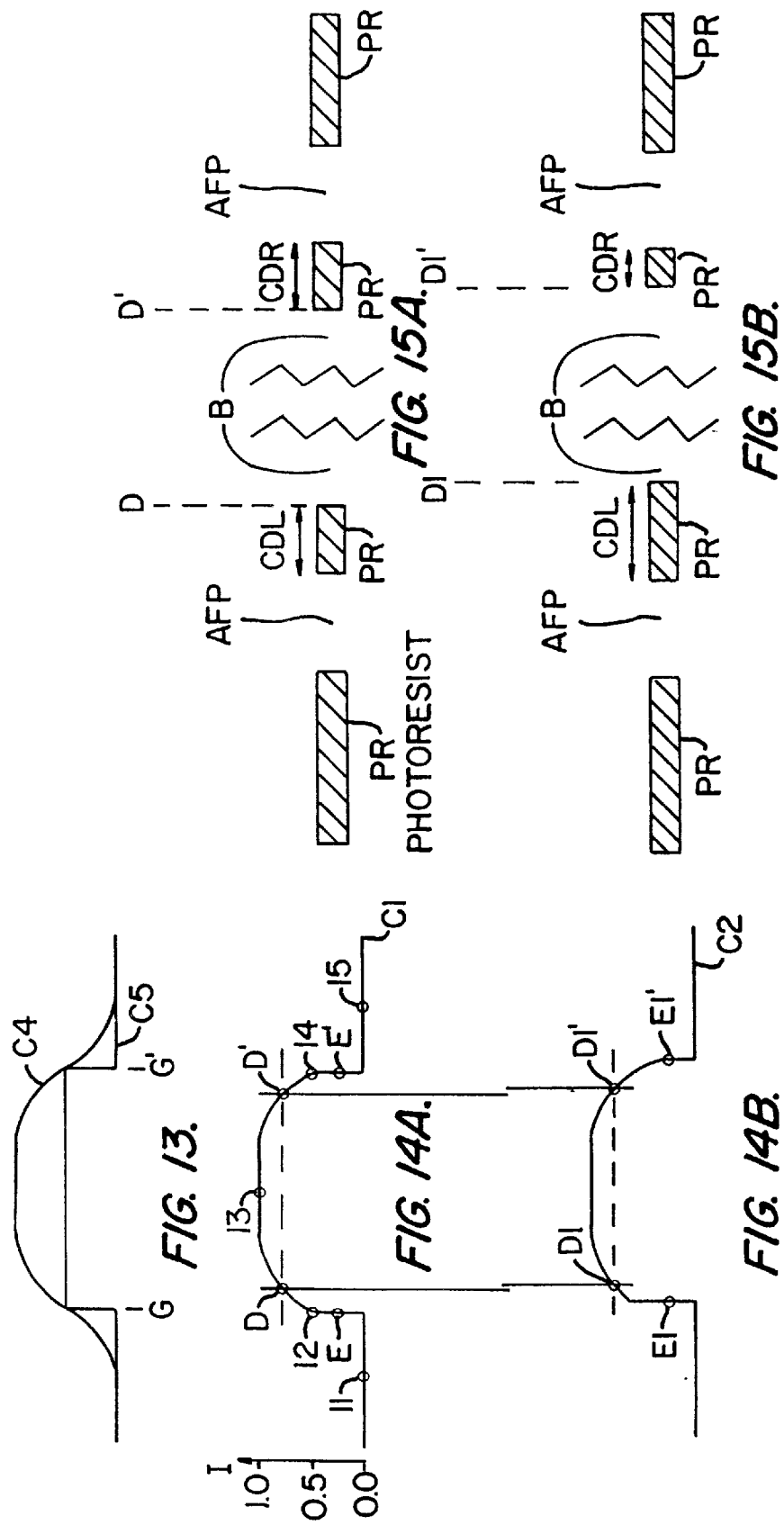

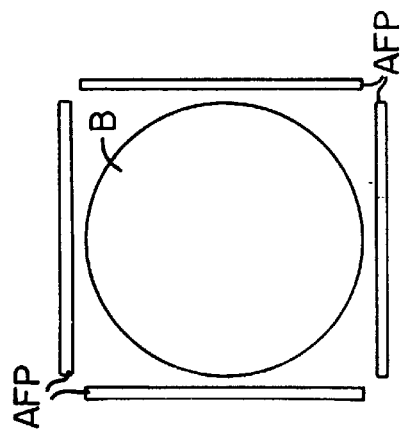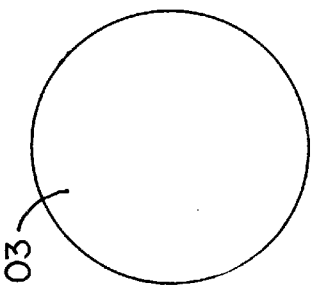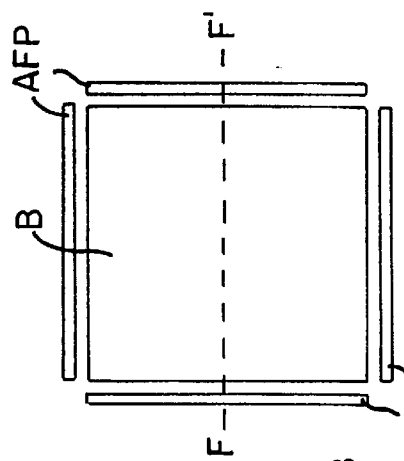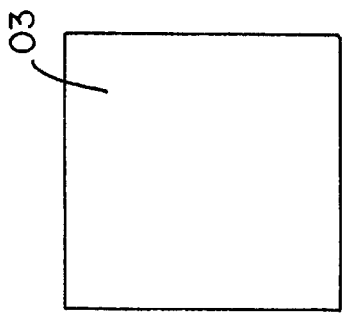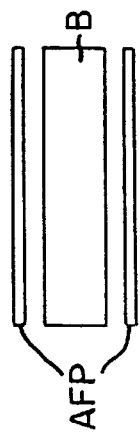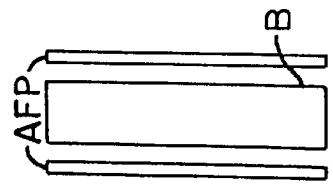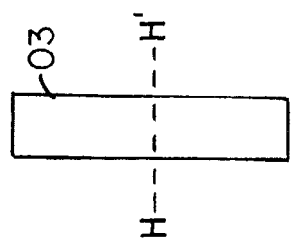

EP = BOUNDARY OF EXIT PUPIL
MP = MASK PLANE PATTERN CONSISTING OF A RECTANGULAR ARRAY OF STREETS AND ALLEYS.
DARK AREAS = CHROME.
WPlm = WAFER PLANE IMAGE OF MP
FIG. 20D = BLOW UP OF SMALL SECTION OF 20C SHOWING THE CRITICAL DIMENSION MEASUREMENT MADE.
FIG. 20E = DOSE (J) VS CRITICAL DIMENSION (CD) PLOT

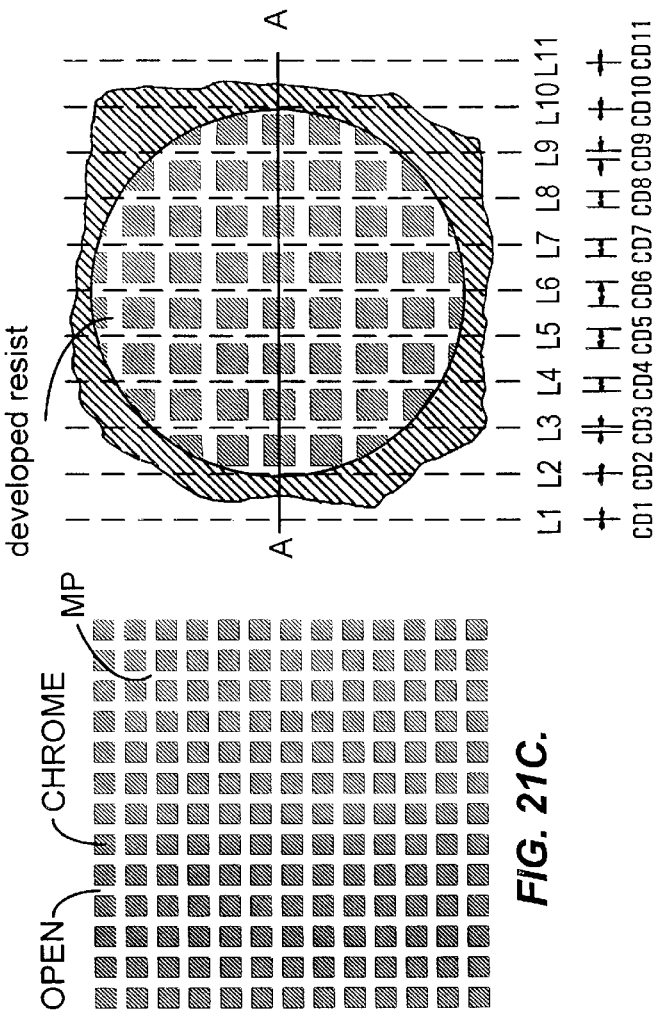
FIG. 21D.
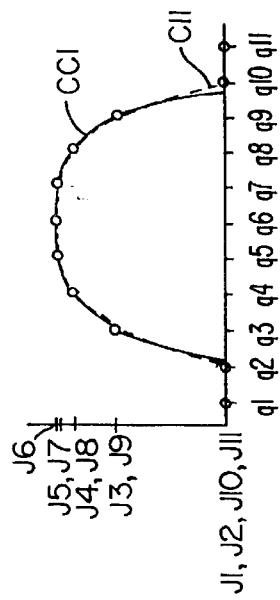
FIG. 21E.
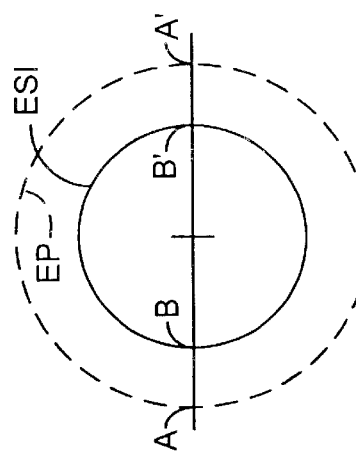
FIG. 21C.
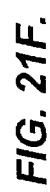
FIG. 21F.
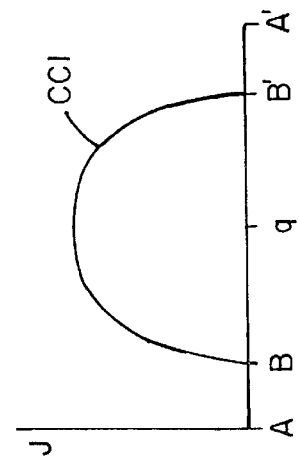
FIG. 21A.
FIG. 21B.

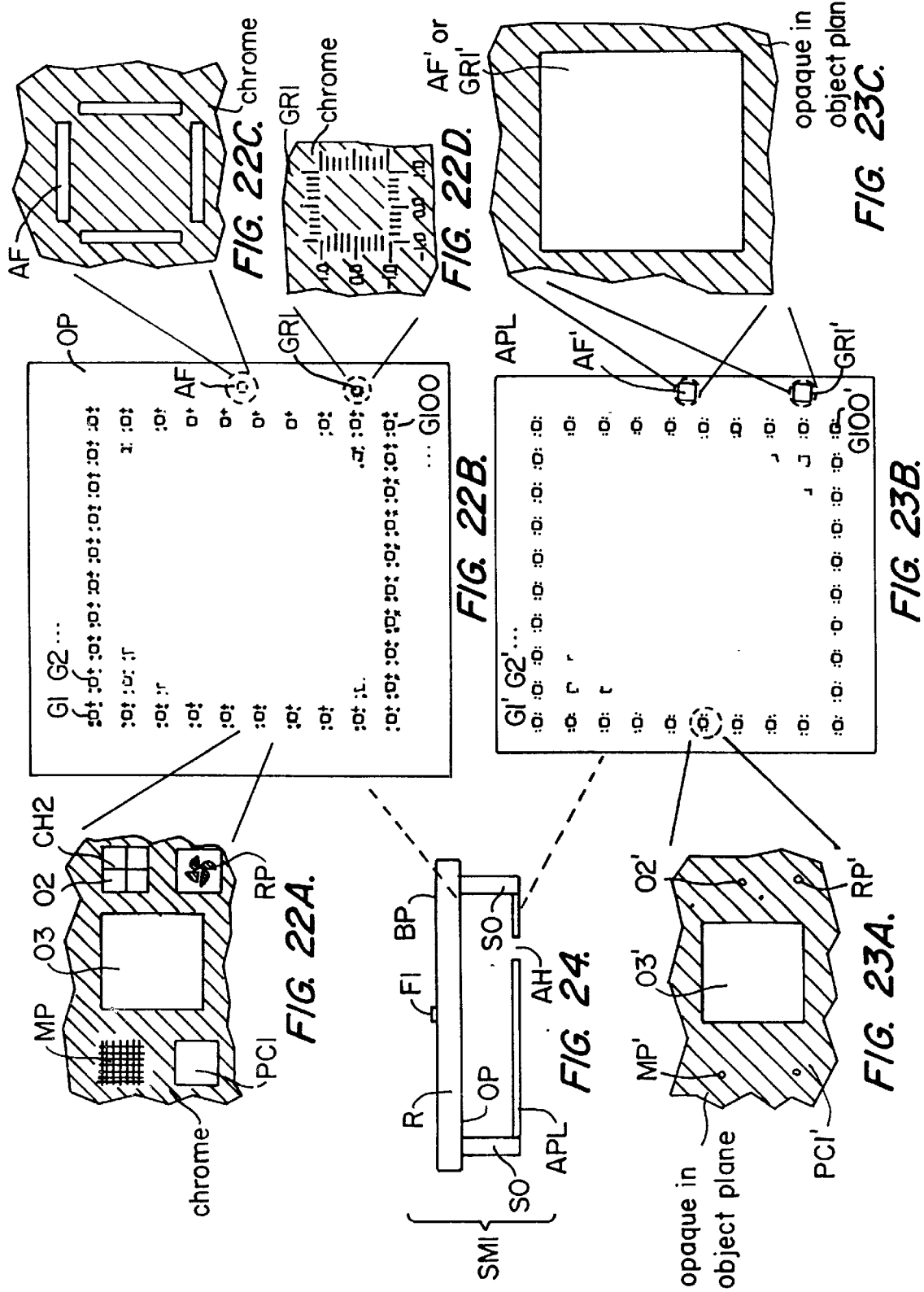

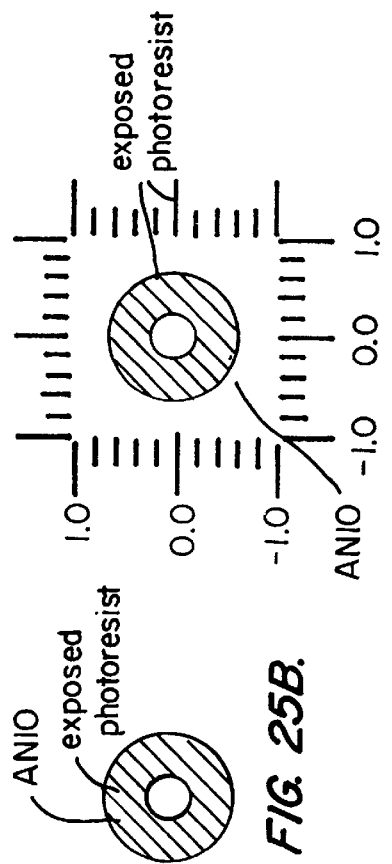
FIG. 25B.
FIG. 25C.
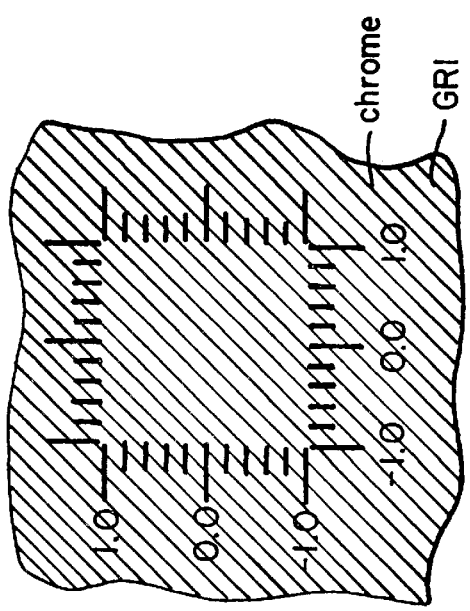
FIG. 25A.
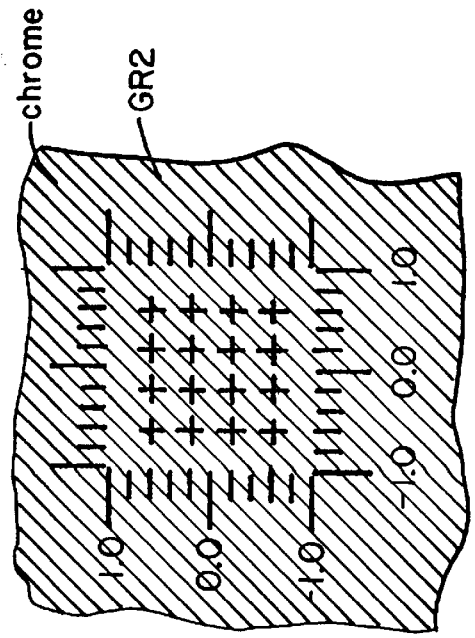
FIG. 26.

IN-SITU SOURCE METROLOGY INSTRUMENT AND METHOD OF USE

This application claims priority from that provisional application entitled "In-Situ Source Metrology Instrument and Method of Use filed as Provisional Patent Application Serial No. 60/074,285, filed on Feb. 11, 1998.

BACKGROUND OF THE INVENTION

FIG. 2 illustrates typical Kohler illumination. The effective source (here a lamp LA) is imaged to the aperture stop AS as LA'. Placing film or other photosensitive material at AS will record the intensity distribution. However, the aperture stop is not generally accessible for this sort of diagnostic. For a circularly symmetricsource, the σ value which is defined as:

$$\sigma = NA_{ill}/NA_o$$

where:

σ partial coherence of effective source $NA_{ill}$ numerical aperture of the cone of radiation defining the effective source.

$NA_o$ numerical aperture of the aperture stop as seen from the object side (entrance pupil)

is generally <1. Thus the aperture stop is typically underfilled by the effective source. Control of σ is important for maintaining uniformity of small (~diffraction limited resolution) features. A study is known wherein σ variation across a stepper FOV resulted in significant linewidth variations. This study used micro structures (400 nm spaces at various pitches) and indirectly inferred through image simulations the value of σ. Such an indirect measurement can only capture one or at most a few parameters characterizing the effective source luminous intensity. A direct method of measurement that separates other effects such as imaging objective aberrations, dose control, photoresist development characteristics and provides a more complete set of information is desirable.

Another effect the effective source has on printed imagery arises from decentration of the effective source with respect to the system exit pupil. This also goes by the name of condenser aberrations or alignment. Condenser alignment can leads to printed image distortion that is a function of defocus. It is important to separate this from distortion which is due to the system imaging objective alone. Many distortion correcting techniques would benefit from a metrology tool that could clearly distinguish that part of the distortion due to condenser setup and that part due to the imaging objective alone.

It is known to use electrical methods (van der Pauw resistors) to ascertain condenser alignment. This technique utilized microstructures at different wafer z positions to infer the z dependent distortion described in reference 6. As such, this technique relied on subtracting out the imaging objective contribution to distortion to arrive at condenser misalignments. A measurement technique that intrinsically and clearly separated imaging objective and condenser effects is desirable.

Other techniques aimed at diagnosing imaging objective behavior, not the effective source distribution include: an insitu interferometer for wavefront determination (ref 8 and ref 9), ref 56 describes an interferometer (noninsitu) for stepper diagnosis, techniques for determining optimal focus, techniques for determining focus and astigmatism only, and general field characterization and qualification techniques.

The current invention is an insitu device that directly measures the luminous intensity (energy per unit solid angle) of the effective source, it's alignment, shape, and size.

A device, method of measurement and method of data analysis are described for imaging and quantifying in a practice sense the luminous intensity of the effective illumination source of an image system. The device, called a source metrology instrument, produces images and other quantitative measurements of the combined condenser and light source that are taken in situ without any significant alteration of the optical or mechanical set up. As such, the device can be used to monitor and assess the coherence properties of the illumination source with a minimum of interruption to the optical tools productive time. It can be used with photolithographic step and repeat reduction or nonreducing image systems (steppers) scanning image systems, fixed fields step and repeat aberration systems, scanning aberration systems, or any other projection imaging or aberration system.

BRIEF DESCRIPTION OF THE DRAWINGS

FIGS. 6a–6d show one technique for assessing source alignment with respect to the exit pupil.

FIGS. 7a–d show another technique for assessing source alignment with respect to the exit pupil.

FIG. 13 shows the object plane transmission and aperture hole effective transmission for an aligned source using the configuration of FIG. 10.

FIGS. 14a–b show respectively the projected intensity pattern for an aligned source and a misaligned one.

FIGS. 15a–b show developed photoresist profiles of FIGS. 14a–b and auxiliary alignment marks.

FIG. 16a shows an object plane pattern in plan view for measuring the X offset of the effective source.

FIG. 16b shows the object plane and aperture plane patterns of FIG. 16a in cross section HH'.

FIG. 16c shows the projected pattern resulting from FIG. 16b as well as auxiliary alignment marks AFP.

FIG. 17a is an object plane and aperture plane pattern for measuring Y offsets of the effective source FIG. 17b shows the projected pattern resulting from FIG. 17a and auxiliary alignment marks AFP.

FIG. 18a is an object plane and aperture plane pattern for measuring X and Y offsets of the effective source.

FIG. 18b shows the projected pattern resulting from FIG. 18a and auxiliary alignment marks AFP.

FIG. 19a is an object plane and aperture plane pattern for measuring X and Y offsets of the effective source.

FIG. 19b shows the projected pattern resulting from FIG. 18a and auxiliary alignment marks AFP.

FIGS. 21a–e illustrate use of a technique for quantifying the effective source using CD measurements.

FIGS. 22a–d is an exemplary object plane layout for the SMI.

FIGS. 23a–c is the corresponding exemplary aperture plane layout for the SMI.

FIG. 24 is a schematic side view of the SMI.

FIGS. 25a–c illustrates another technique for displaying and measuring the effective source luminous intensity.

FIG. 26 is another object plane pattern that could be used in the schematic illustrated in FIGS. 25a–c.

DETAILED DESCRIPTION OF THE INVENTION

Figure 1:
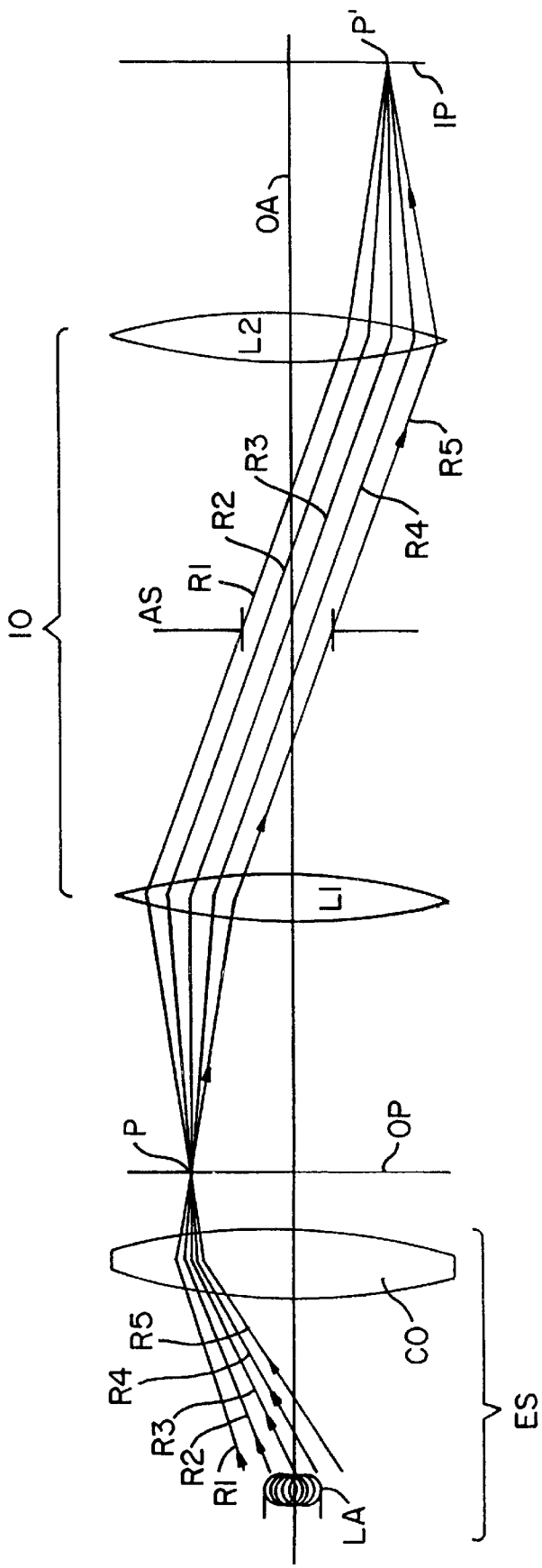
FIG. 1 is a functional schematic of a projection imaging system beamtrain showing the raypaths arising from a single point in the object plane.
Figure 2:
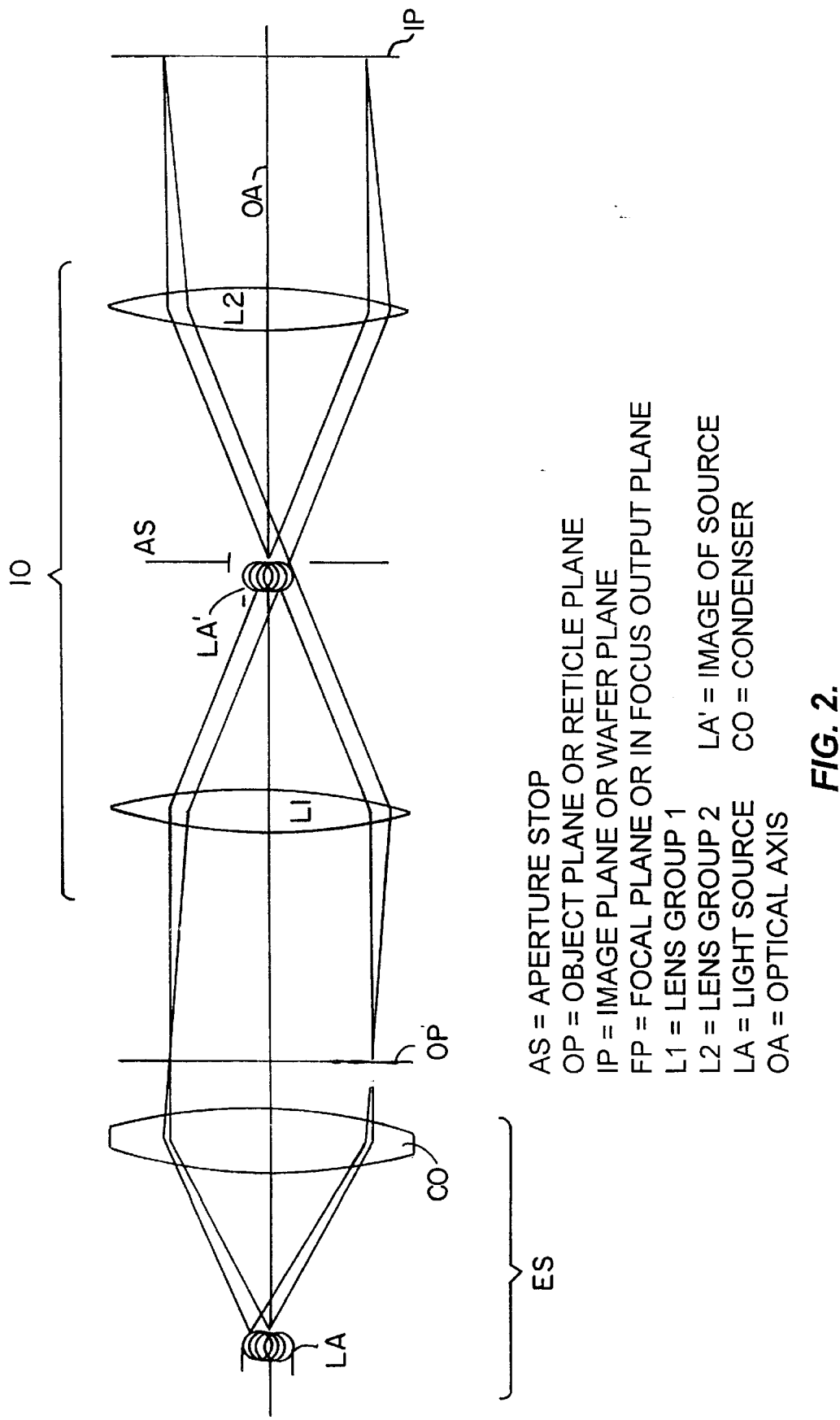
FIG. 2 is a functional schematic of a projection imaging system beamtrain showing the raypaths arising from two distinct points in the effective source.

FIG. 1 is a functional schematic of a projection imaging system beamtrain. Principal optical subsystems are effective source, ES (drawn as a lamp LA and condensing lens CO), imaging objective, IO (consisting of lens groups L1, L2), and aperture stop AS. Object and image planes are labeled OP and IP respectively. ES is simplified for discussion purposes; in steppers it can contain homogenization rods, fly's eye's, and other beamshaping and scrambling optics. IO is likewise simplified. A point P in object plane OP is typically illuminated by a bundle of rays (of which raypaths R2, R3, R4 are examples) that underfill the aperture stop AS. In microlithographic applications, this is done to control image contrast. If the effective source ES is properly aligned, then the light distribution is centered within aperture stop AS and the rays converging on point P' are centered in the exit pupil which is telecentric. Having the effective source centered in a telecentric output pupil means there is no distortion that is a function of defocus (shifts in the location of plane IP). In FIG. 1, the effective source is centered in the exit pupil. Decentration of the source with respect to the exit pupil would occur if lamp LA were shifted so that now only raypaths R1, R2 and R3 are illuminated while R4 and R5 are not illuminated. One of the objects of this invention is to directly quantify such misalignment of the effective source ES with respect to the exit pupil.

Another deleterious imaging effect is the variation in partial coherence across the imaging field. This is known to cause linewidth variation and has been observed. The present invention can accurately measure this quantity.

Figure 3:
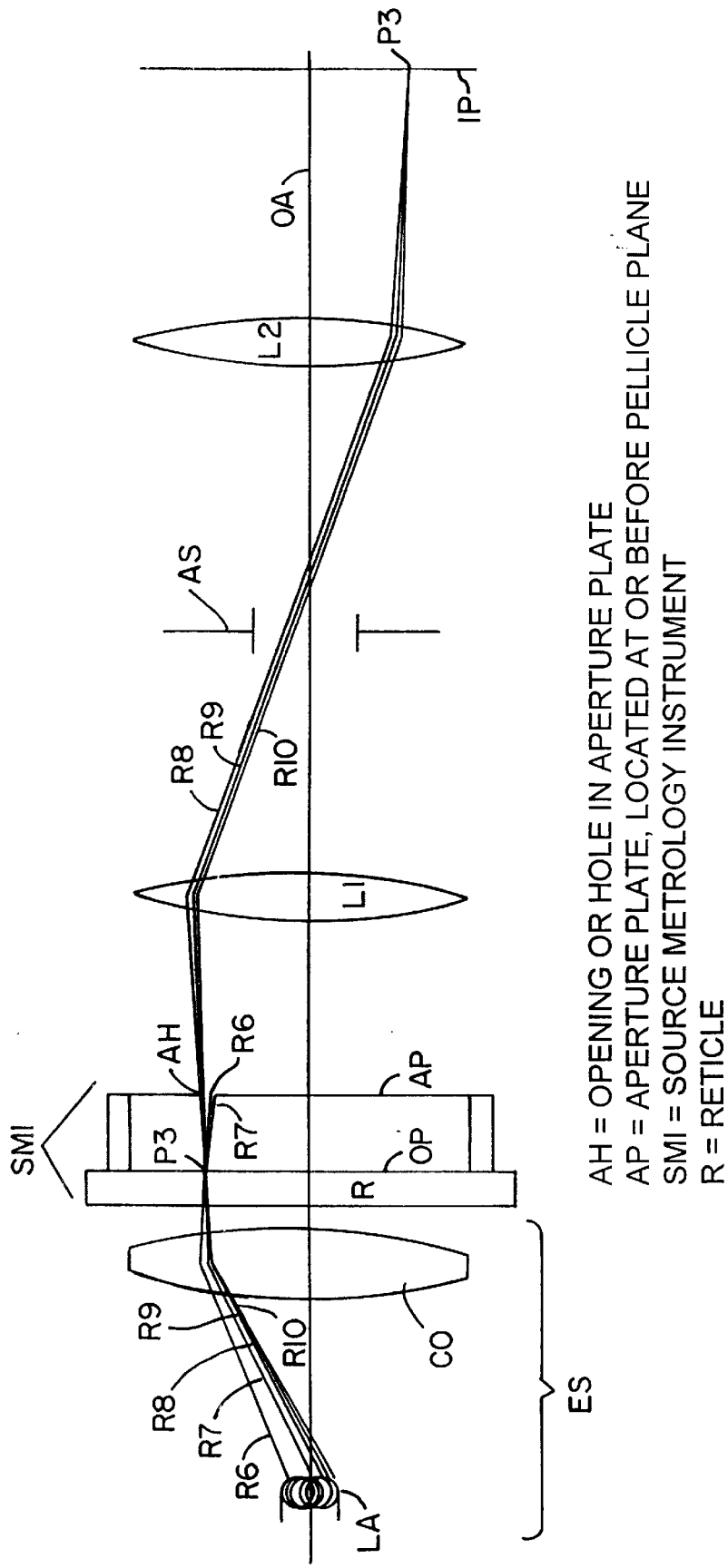
FIG. 3 is a functional schematic of a projection imaging system beamtrain with the SMI inserted showing the raypaths arising from a single point in the object plane.
Figures 4A, 4B:
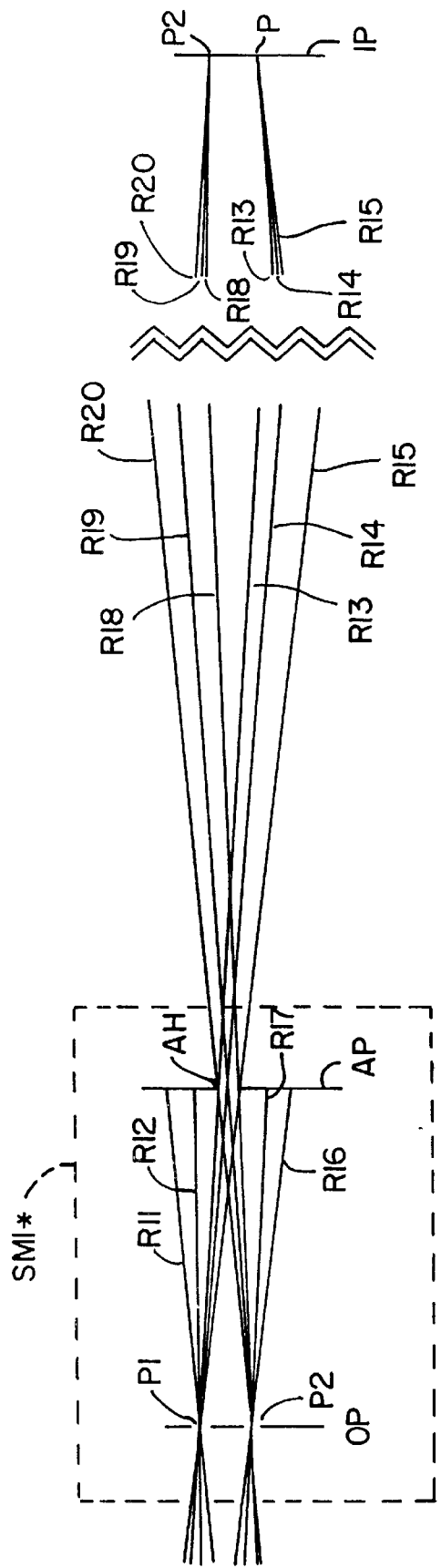
FIG. 4a shows the ray paths arising from two nearby points in the object plane that pass through a common aperture hole.
FIG. 4b shows the rays and nearby points of FIG. 4a as relayed to the image plane.
Figure 5:
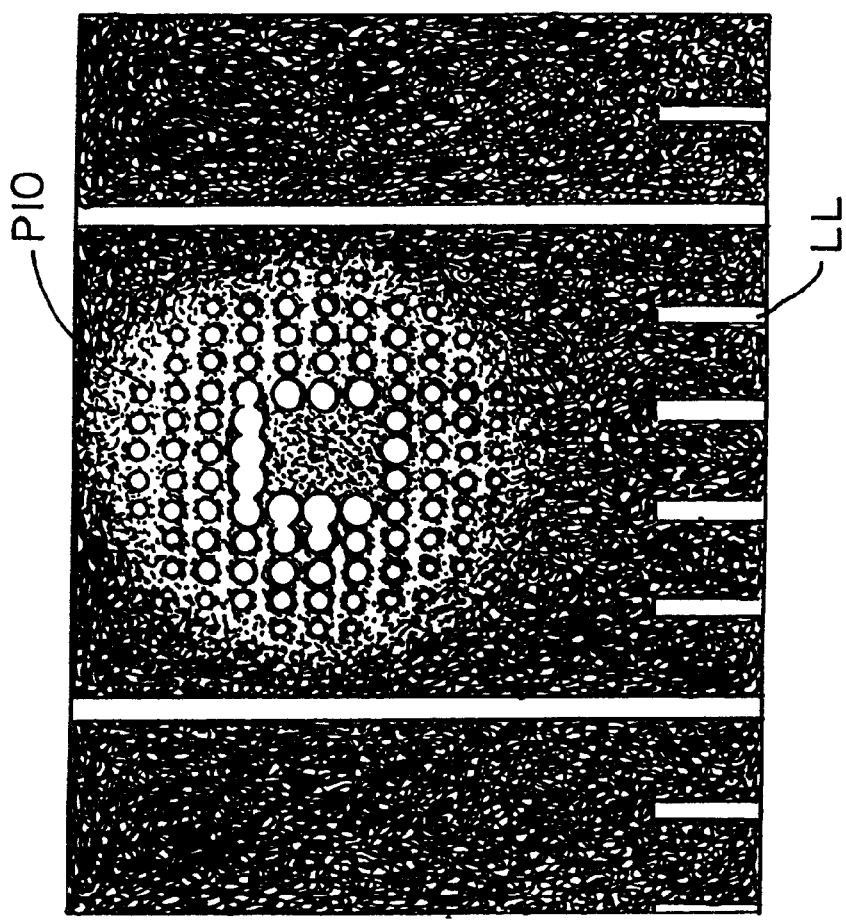
FIG. 5 is a photo of the effective source of a projection imaging system as taken by this invention.

FIG. 3 shows the basic mechanism for forming images of effective source ES Source metrology instrument, SMI, consists of reticle R, and aperture plate AP having an aperture hole or opening, AH in it. Raypaths R6–R10 emanating from ES and passing through point P3 of the object plane OP strike aperture plate AP with paths R6, R7 terminating there with paths R8, R9, R10 passing through and converging at the image point conjugate to P3, namely P3'. So there is a bundle of raypaths, of which R8, R10 are marginal and R9 chief raypaths, emanating from only a portion of effective source ES that make up image point P3'. R9 is a chief ray path in the sense that it passes through the center of aperture hole AH. Thus the intensity of light rat P3' is proportional to the luminous intensity (power per unit solid angle) of the portion of effective source ES passing through object plane point P3 and aperture hole AH. FIG. 4a is a closeup of a section of source metrology instrument, SMI*, showing two nearby points, P1+P2, and corresponding raypaths from ES (not shown) convergent thereon. The effect of aperture hole AH is to allow only a portion of the raypaths emanating from effective source ES (not shown) to pass and reform in image plane IP (FIG. 4b) at conjugate points P1'+P2', Since different parts of the effective source are imaged at points P1' and P2', we get an image of the effective source (blurred only by the size of aperture AH and diffraction effects) at image plane IP. This is obtained by placing a photoresist coated wafer at IP, exposing with the SM1 in place, and developing the water. The result of this process is illustrated in FIG. 5 which shows the image of the effective source as produced with an SMI according to this technique. Exposed pattern P10 consists of a pattern of dots of varying intensities. Grid lines LL were put down separately and are 50 micron apart. Projected diameter of the exit pupil is ~240 micron so the partial coherence of P10 as determined by thee outer dot to outer dot distance is σ~0.75.

The mathematical description of this image formation process is as follows. Let the following symbols take on the following meanings:

| (xo,yo) | transverse (perpendicular to the optical axis) position of point in the object plane |
|---|---|
| (xa,ya) | transverse position of center of aperture hole |
| z | object plane to aperture plane distance |
| D | diameter of aperture hole |
| M | reduction ratio of imaging system (M:1) |
| (xi,yi) | position of point (xo,yo) mapped to image plane |

The imaging objective maps the object point at (xo,yo) to a point on the image plane at (xi,yi)=(xo/M,yo/M). An inversion merely rotates the pattern by 180 degrees which effect can be accommodated by similarly rotating the image plane coordinate system. Presence of an aperture at point (xa,ya) allows only rays from the effective source that are within a cone centered on angle (qx,qy)=((xa−xo)/z, (ya−yo)/z) and of full cone angle=D/z to pass .These considerations have utilized the paraxial approximation for illustration, exact expressions are readily derivable. The aperture stop ultimately limits the range of incident ray angles reaching the image plane. The above discussion has been limited to object side, telecentric systems but can be easily generalized to include, nontelecentric object side systems and exact mathematical relationships. Diffraction can also be included.

A exemplary practical device constructed along these lines for use in a microlithographic wafer stepper is as follows. So that the entire SMI can be automatically loaded with the normal reticle handling equipment, it's envelope must be no larger than a standard reticle-pellicle combination. FIG. 24 illustrates the general arrangement. A standard dimension reticle plate R has written on the object plane (OP) side the chrome pattern of FIG. 22b (shown in further detail in FIGS. 22a, 22c and 22d). It consists of a 10×10 array of pattern groups (G1, G2, . . . , G100), auxiliary alignment fiducial AF, and calibration pattern GR1 spread across the imaging objective field of view. The outer envelope of aperture plate APL is separated from object plane OP with standoffs SO by a distance no greater than the pellicle standoff distance, typically 5 mm. The transverse dimensions of aperture plate APL are no greater than the pellicle size, which are generally less than the reticle size. Aperture plate APL consists of openings arranged in groups (G1', G2', . . . , G100') which are in 1—1 correspondence with the groups in the object plane (FIG. 22b). A closeup of an individual object plane group (FIG. 22a) shows an opening in chrome, PC1, that when used in combination with an opening in the aperture plate (PC1', FIG. 23a) that together comprise a pinhole cameras for the effective source. Such a combination was used to make the image of FIG. 5.

Opening PC1 is made large enough that it's edges are not imaged; said differently, the outer edges of PC1 are situated at an angle relative to aperture hole PC1' that falls outside the imaging objective entrance pupil.

Mathematically:
z=object plane to aperture plane distance
NAo=numerical aperture of imaging objective on the object side
D=diameter of opening PC1'
R=radius or half width of opening PC1
then R must satisfy the inequality:

$$R > D/2 + z*\tan(\sin(NAo)) \quad (eq\ 1)$$

if the edge of the PC1 is not to be imaged at all.
Typical values for these quantities would be:
z=5 mm
D=0.10 mm
NAo=0.12 => R>0.655 mm.
Thus in this case, the size of square opening PC1 of FIG. 22a would be greater than 1.31 mm.

Source Centration Metrology

Having an effective source that is not centered on the exit pupil causes image distortion as a function of defocus (see ref 6 and 60). If the source position relative to the exit pupil is known, the effective source can be adjusted (condenser alignment) to correct this condition. What follows are a number of techniques for measuring source centration.

One technique uses a crosshair (FIG. 22a, CH2) centered over an opening in the aperture plane (FIG. 23a, O2'). The outer clear window, O2, framing crosshair CH2 has a minimum size (set by eq. 1) such that it's edges do not print. Thus only the crosshair blocks light coming from the effective source. The resulting printed image is a cross obstructing portions of the effective source. Since in construction of the SMI the cross is centered on the nominal system exit pupil, we can read off any misalignment by looking for a shift of the source with respect to the printed cross hairs. FIGS. 6a–6d illustrate this mechanism in more detail. FIG. 6a is the crosshair, CH1, and exit pupil, EP, as transferred back to the object plane OP of the SMI. FIG. 6b shows the luminous intensity of the effective source, AI0, centered within the exit pupil EP The effect of centered source AI0 passing through the object plane crosshair CH1 and an opening in the aperture plane is shown in FIG. 6c where the projected image of the effective source, AI1, now includes obstructions due to the cross hair CH1. The projected image is in the imaging system image plane IP. In a positive resist, the dark region of FIG. 6c would be exposed and developed out. Now should the effective source (AI0 of FIG. 6b) be shifted relative to the exit pupil EP, the resulting printed feature would be FIG. 6d. The shift with respect to the exit pupil can be read off from the relative position of the outer or inner circle of AI2 with respect to the intersection of the imprinted cross hairs.

To be useful with more structured effective source distributions such as the quadrupole source, QI0, of FIG. 7b, a different crosshair arrangement (CH2 of FIG. 7a) could be employed. The corresponding aligned and misaligned effective source images are shown in FIGS. 7c and 7d respectively. Again, the intersection point of the printed cross hairs allows us to determine the position of the effective source relative to the exit pupil.

Figure 8A:
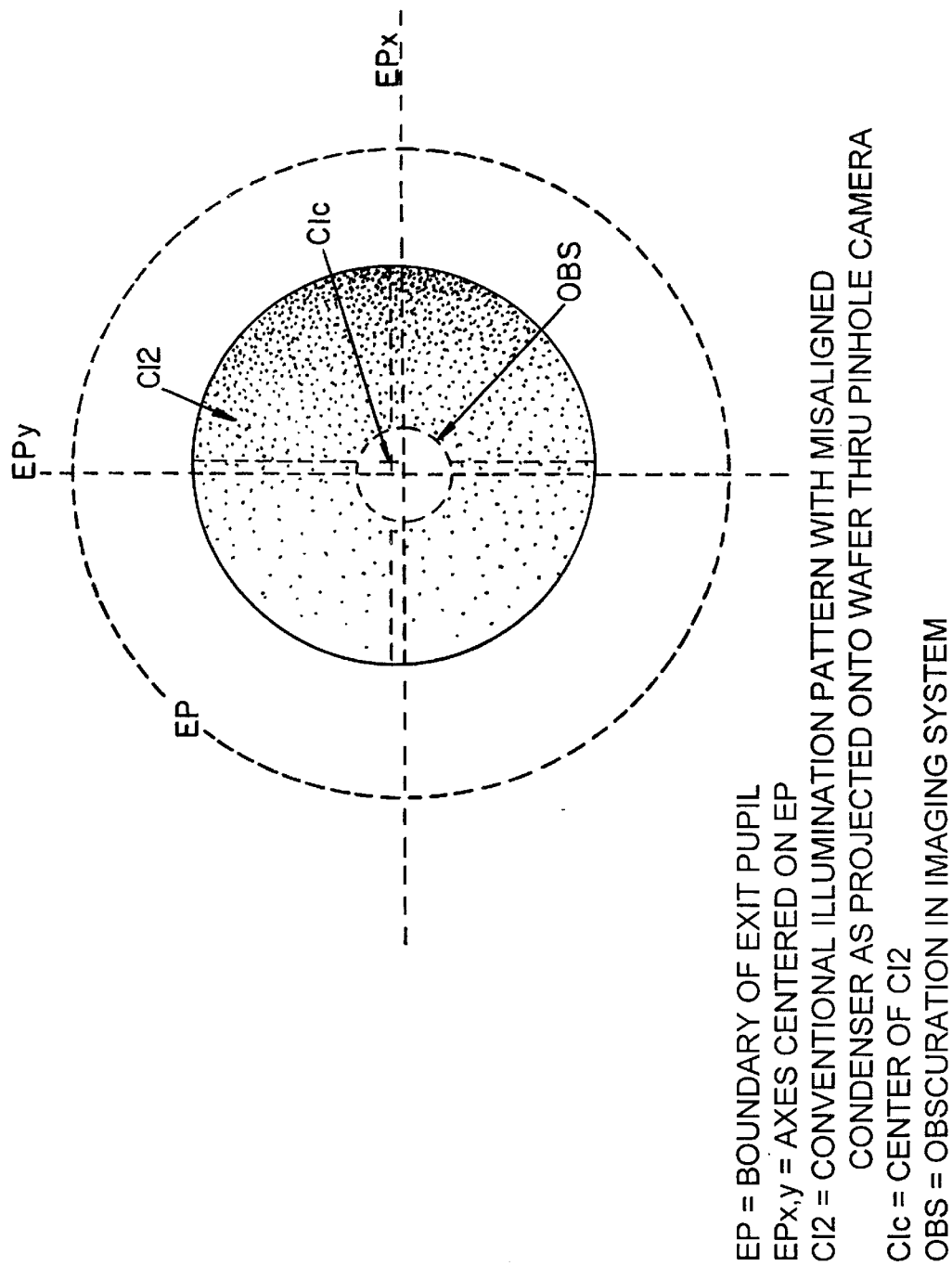
FIGS. 8a–c show yet another technique for assessing source alignment with respect to the exit pupil.
Figure 8B:
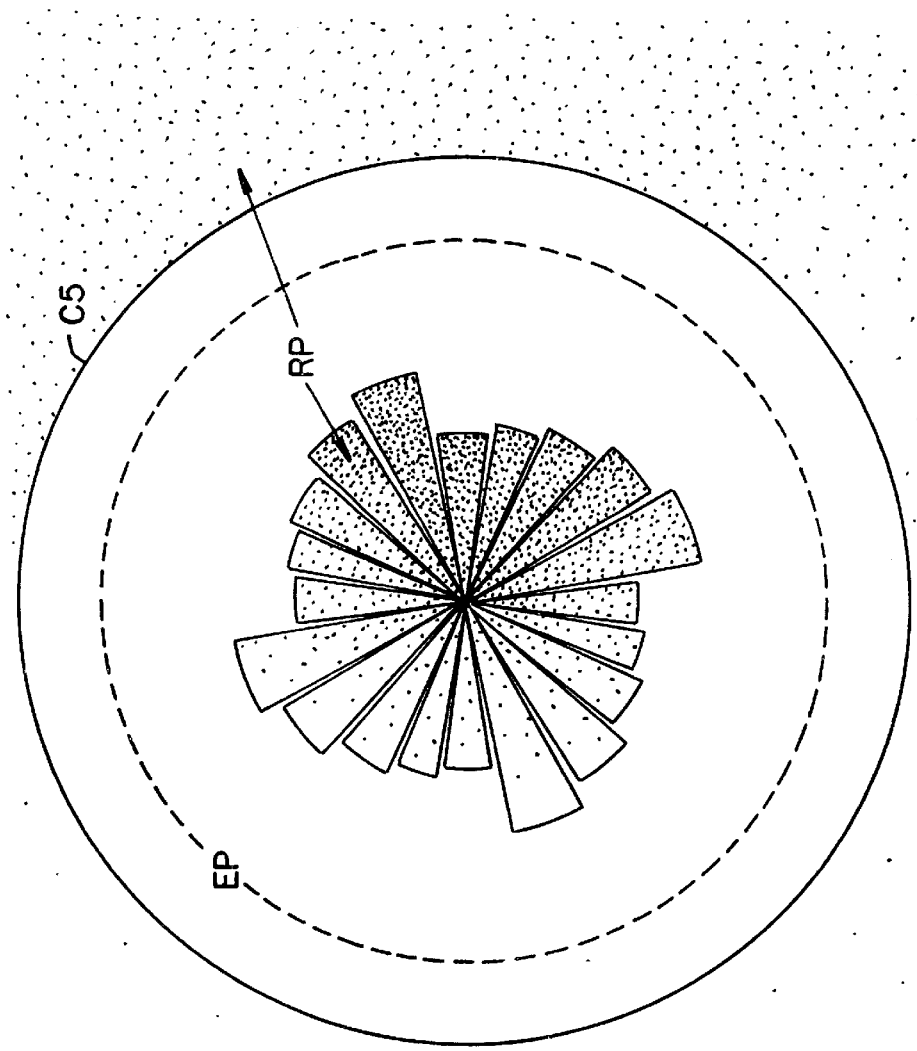
Figure 8C:
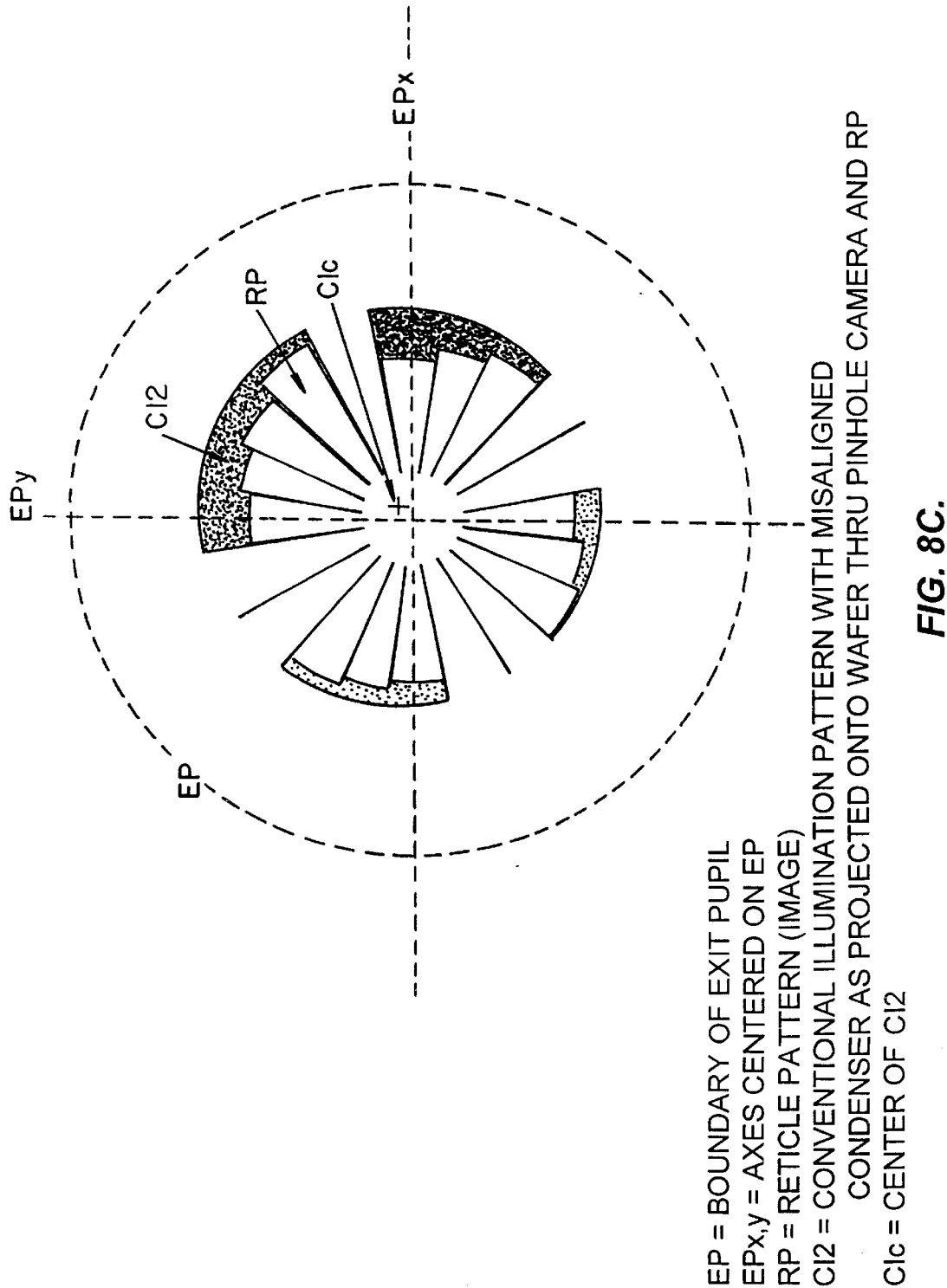
Figure 9:
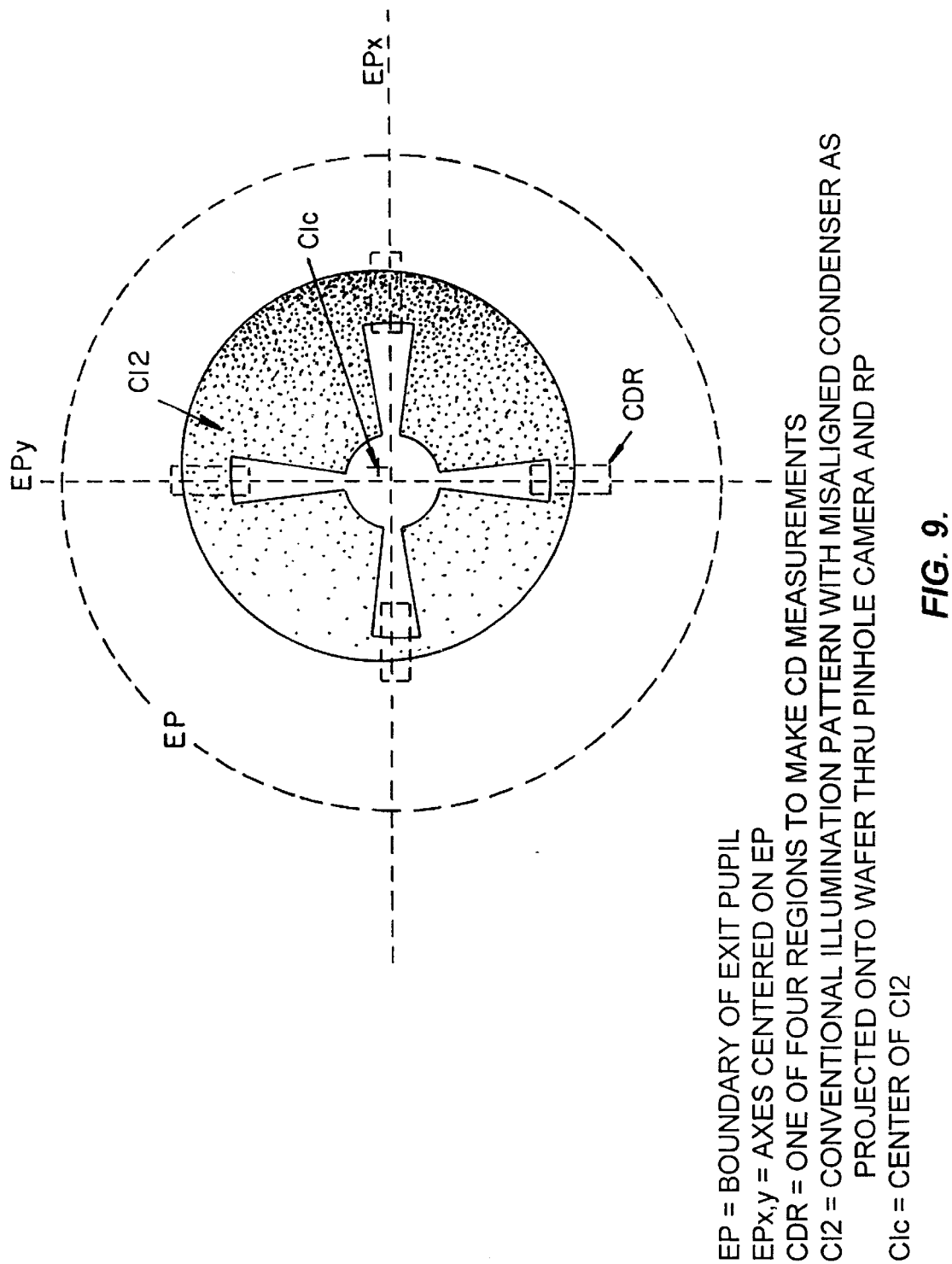
FIG. 9 shows the use of a CD metrology tool to assess effective source centration.

Another centration technique is illustrated in FIGS. 8a–c. The shaded region, CI2, in FIG. 8a shows the exposed image that would be obtained at the wafer from a simple pinhole AH in the aperture plane AP for a stepper with conventional illumination with (partial coherence) σ~0.6, and an obscuration in the imaging objective (OBS). CIc depicts the center of the exposed image and its offset from the center of the exit pupil EP. Epx and Epy lines (lines not imaged) indicate the illumination system is misaligned. FIG. 8b shows the reticle pattern (RP) for measuring effective source centration error. The outer reticle circular aperture, C5, should be significantly larger than the image of the imaging lens's aperture stop backprojected through the pinhole (eq. 1). The mean radius of the arc sections should be approximately σ*NAo*z where:

σ=partial coherence of effective source
z=aperture plane AP to object plane OP distance
NAo=numerical aperture of the imaging objective on the object side. The resulting pattern exposed on a wafer due to the reticle pattern of FIG. 8b and effective source of FIG. 8a is shown in FIG. 8c. This pattern can be maniually inspected to look for decentation. By choosing the radius variation and number of arcs in reticle pattern RP appropriately, simply counting the untruncated arcs per quadrant can yield a coarse quantitative estimate of the decentration. Alternatively, the widths of the exposed regions at 0/180 and 90/270 degrees could be measured and differenced to yield a quantitative illumination offset. FIG. 9 shows the appropriate subset of FIG. 8c (0, 90, 180 and 170 degrees) to measure with standard CD measurement tools. The 4 CD measurements are taken at the areas indicated by dashed boxes (FIG. 9) and are $CD_0$, $CD_{90}$, $CD_{180}$ and $CD_{270}$, the subscript corresponding the angle the measurement is taken at relative to the pattern center. Angular offsets of the exit pupil, $\Delta\theta x$ and $\Delta\theta y$ are then given approximately by:

$\Delta\theta x = M^2/z*(CD_0 - CD_{180})$
$\Delta\theta y = M^2/z*(CD_{90} - CD_{270})$ The structure of FIG. 8b and corresponding aperture hole are incorporated in the exemplary SMI of FIGS. 22 and 23 (specifically, RP in FIG. 22a and RP' in FIG. 23a).

Another technique for determining effective source centration is implemented in FIGS. 22 and 23. Opening O3 (FIG. 22a) in object plane OP sits directly above (or along the chief ray trajectory in non-telecentric systems) an identically sized opening O3' (FIG. 23a) located on the aperture plate APL. These are spread out in a 10×10 group over both object plane (OP) and aperture plate (APL). In addition there are alignment fiducials AF (detailed in FIG. 22c) in the object plane OP and a corresponding oversized window (AF' detailed in FIG. 23c) directly below AF in the aperture plate APL.

The principle of operation of this technique is depicted in FIGS. 10–15 and will first be briefly described. When the effective source is centered on the nominal exit pupil, then the combination of O3 and O3' makes a first image (when slightly overexposed) that is centered on the location of the conjugate image of O3 alone (that is O3 if aperture plane AP was unobstructed). A second image still more overexposed will yield the conjugate of O3. Thus the two images will be centered at the same location. When the effective source is decentered with respect to the exit pupil, the first image will be shifted with respect to the second image. This shift is detected by printing alignment fiducials AF (FIG. 22c) producing a net pattern similar to FIG. 18b and then measuring the shift of the center box B with respect to printed alignment fiducials AFP using a CD metrology tool.

Figure 10:
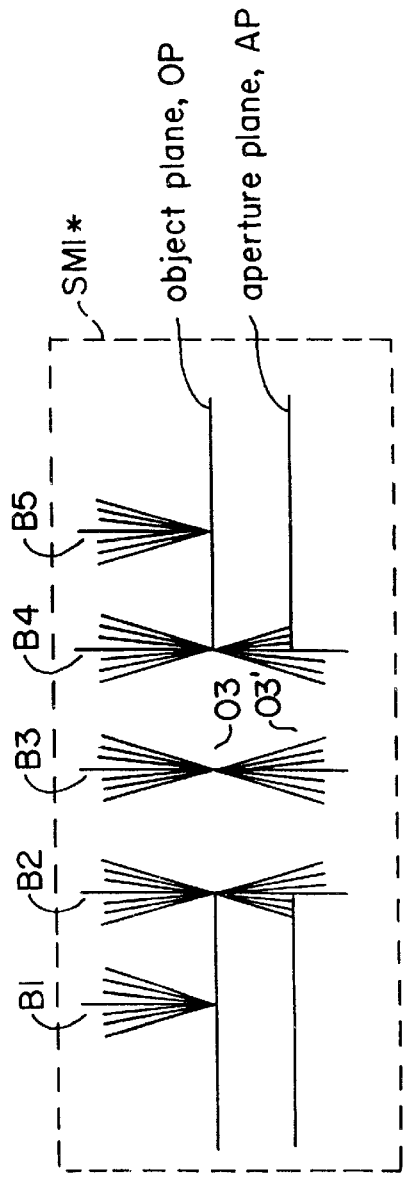
FIG. 10 is a section of the SMI and ray bundles passing through 3 points that is used for a fifth technique for assessing source alignment with respect to the exit pupil.
Figures 11A, 11B, 11C, 11D, 11E, 11F, 11G:
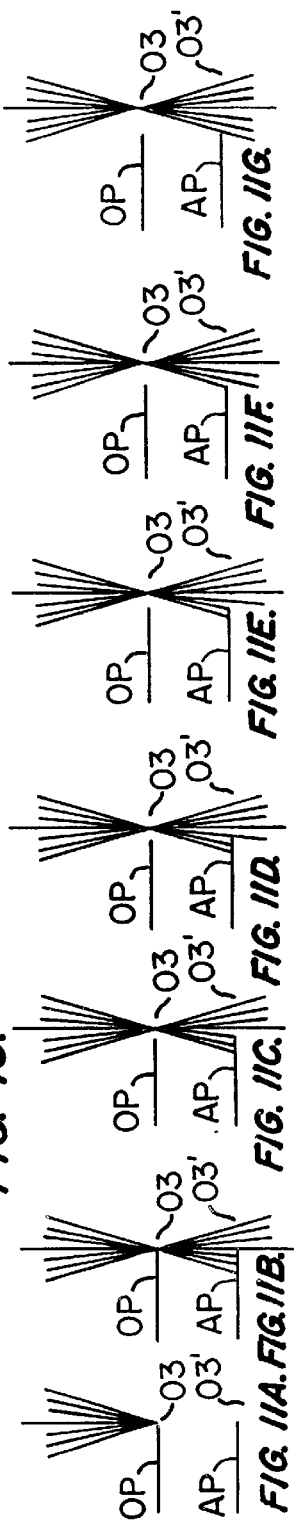
FIGS. 11a–g shows ray bundles of a properly aligned source at transversely displaced locations relative the left edge.
Figures 12A, 12B, 12C, 12D, 12E, 12F, 12G:
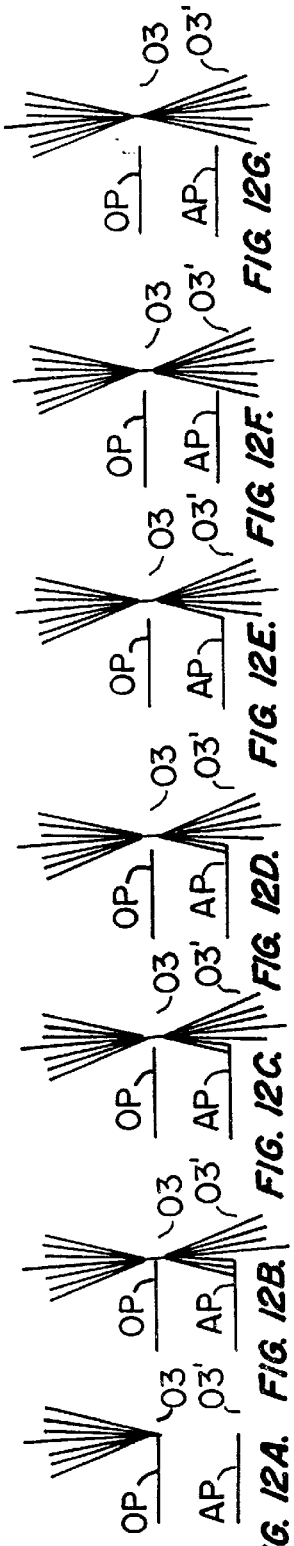
FIGS. 12a–g shows ray bundles of a misaligned source at transversely displaced locations relative the left edge.

FIG. 10 is a section of the SMI, denoted SMI*, and ray bundles (B1–B5) arising from an effective source centered on the nominal exit pupil passing through 5 points in the object plane. Imaging system chief rays (rays that pass through the center of the aperture stop) are denoted by their extra length. O3 is a section of opening O3 of FIG. 22a while O3' is the corresponding crosssection of opening O3' of FIG. 23a. B1 is completely outside the opening O3 so the intensity projected to image plane IP is zero corresponding to point I1 on intensity curve C1 of FIG. 14a. Bundle B2 is incident just inside the left edge of opening O3, but approximately half of the rays in the bundle are outside the clear opening O3'; therefore, the intensity of light reaching the image plane is approximately half of what it would be if all the rays were passed. This corresponds to point I2 of intensity curve C1. Bundle B3 is incident of the middle of opening O3 and all of it's rays get through openings O3 and O3'. This corresponds to point I3 of intensity curve C1. Bundle B4 passes just inside the right edge of O3 and corresponds to point I4 of intensity curve C1. Bundle B5 passes right of the right edge of opening O3 and corresponds to point I5 of intensity curve C1. FIGS. 11a–11g illustrate other ray bundles originating from an effective source that is aligned with respect to the nominal exit pupil and incident in the neighborhood of the left edge of opening O3. Note that as the point of incidence in the plane of O3 moves to the right, a gradually increasing # of rays (e.g. amount of light) is allowed to pass through opening O3'. From this, we see how the curve C1 (FIG. 14a) is filled in between the points I2 and I3. Similar considerations on the right edge of opening O3 would fill in curve C1 between points I3 and I4. Now if $E_0$ is the nominal dose to clear the photoresist when exposing a completely blank reticle, then an exposure dose ~1.33 $E_0$ the region between points D and D' of curve C1 would be cleared. While at exposure dose ~4 $E_0$ the region between points E and E' of curve C1 would be cleared. Note that these two regions, D–D' and E–E' as printed in photoresist would be centered on each other. The metrology to check source centration is illustrated in FIG. 15a and FIG. 18b. Alignment fiducials AF of FIG. 22c are offset and printed so as to be nominally centered on box B, box B being the image resulting from the effect of apertures O3 and O3'. Object plane feature AF is printed through an opening AF' in the aperture plane large enough that the entire ray bundle arising from each point in the open areas of AF is not in any way obstructed by the borders surrounding AF'. Thus this feature would print at dose $E_0$. The result is FIG. 18b (located in the image plane) with AFP being feature AF nominally centered on B. A cross section of the exposed and developed resist along line F–F' is drawn in FIG. 15a. PR denotes remaining photoresist. Left-right centration of B with respect to projected alignment fiducials AFP is done by first measuring the 2 critical dimensions $CD_L$, and $CD_R$ and taking their difference $\Delta CD = CD_R - CD_L$. This procedure is done twice at exposure levels corresponding to points D–D' (~1.33 $E_0$) and E–E' (~4 $E_0$) with resulting CD differences $\Delta CDa$ and $\Delta CDb$ respectively. The angular misalignment of the source with respect to the exit pupil in the x direction is then given by:

$$\theta x = (\Delta CDa - \Delta CDb) * M^2 / z \quad \text{(eq 2)}.$$

The y angular offset is similarly given by:

$$\theta y = (\Delta CDc - \Delta CDd) * M^2 / z \quad \text{(eq 3)}.$$

The meaning of the symbols in eq 2 and 3 is provided in the following table:

| | |
|---|---|
| $\theta x$ | angular misalignment of the source with respect to the exit pupil in the x direction |
| $\theta y$ | angular misalignment of the source with respect to the exit pupil in the y direction |
| $\Delta CDa$ | low dose CD difference in the x direction = $CD_R - CD_L$ |
| $\Delta CDb$ | high dose CD difference in the x direction = $CD_R - CD_L$ |
| $\Delta CDc$ | low dose CD difference in the y direction = $CD_T - CD_B$ |
| $\Delta CDd$ | high dose CD difference in the y direction = $CD_T - CD_B$ |
| M | imaging objective reduction ratio (M:1) |
| z | object plane to aperture plane (O3 to O3') distance |
| $CD_T$ | CD at pattern top (90 degrees) |
| $CD_B$ | CD at pattern bottom (270 degrees) |

The case of a decentered effective source is illustrated in FIGS. 12a–g, FIG. 14b and FIG. 15b. Tilted raybundles in FIGS. 12a–g are shows laterally displaced in succession and the resulting rays that make it past O3' allow us to calculate intensity curve C2 which represents of the image projected to the wafer plane. The low intensity exposure (Line D1–D1' of FIG. 14b) is now shifted with respect to the high intensity exposure (E1–E1' of FIG. 14b). The shift is illustrated through the cross section of F–F' of FIG. 18b in FIG. 15b. CD measurements Cdl and Cdr are not equal at lower dose exposures but become equal at higher doses. In general practice more than 2 doses would be used to get better statistics for the data reduction.

An easy way of constructing these intensity curves is shown in FIG. 13. If C4 represents the intensity at the image plane if only opening O3' is present (O3 for the moment is assumed to be much larger than O3') and C5 represents the intensity at the image plane if only opening O3 is present (O3' for the moment being assumed to be much larger than O3) then the effect decentration is to shift curve C4 transversely. The non-vanishing part of the curve is always that part between points G and G'. In this manner the curves C1 and C2 of FIGS. 14a and 14b are constructed.

Alternative forms of this device are shown in FIGS. 16, 17 and 19. In all cases, the corresponding opening in the aperture plate (O3') is of the same size and shape and aligned to the opening O3 in the object plane.

Because exposure of O3 type alignment marks takes place using close to t he nominal clearing dose, it may be desirable to include filters (FI of FIG. 24) located on the backside of reticle R and individually aligned with each opening O3 to decrease the intensity of light. This would be done to minimize blooming or spillover effects onto nearby features printed within the same group.

Source Map

A quantitative technique for determining the luminous intensity of the effective source will now be described. Referring to FIG. 22a, street and alley pattern MP with size larger than R of eq. 1 is made. The number of lines depends on the resolution required but is typically ~5–20 across.

Figure 20A:
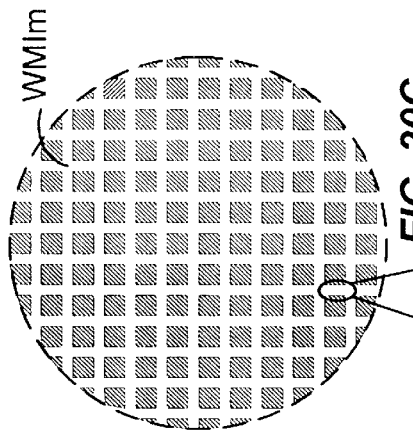
FIGS. 20a–d describe a technique for quantifying the effective source using CD measurements.
Figure 20B:
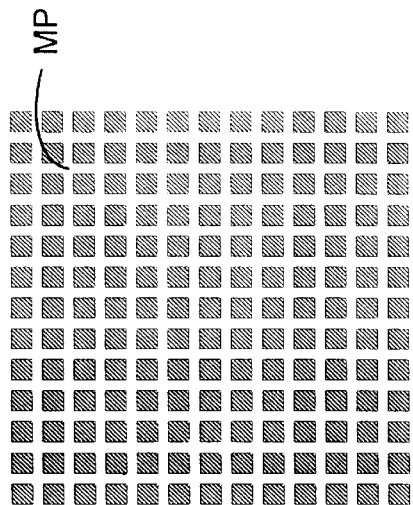
Figure 20C:
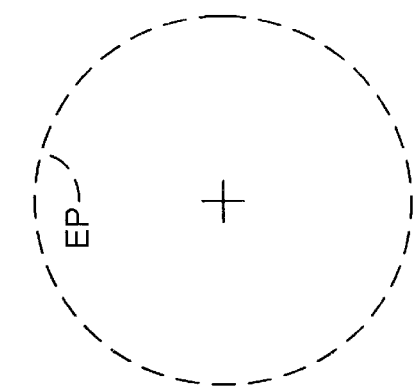
Figure 20D:
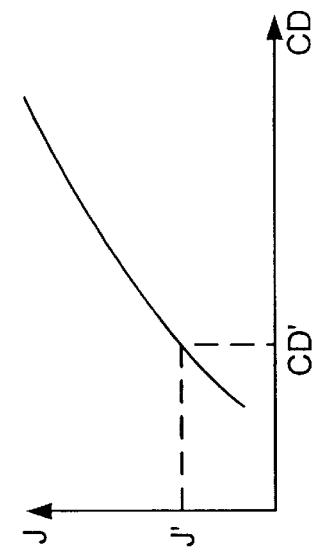
Figure 20E:
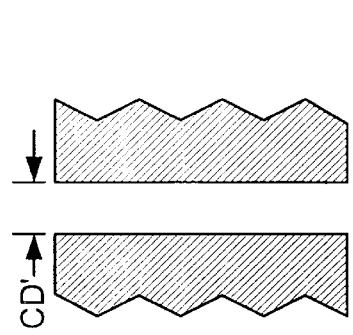

Corresponding aperture hole MP' in the aperture plate is underneath (FIG. 23a). FIGS. 20 and 21 illustrate device operation. FIG. 20b shows the interior part of mask or reticle plane pattern MP. FIG. 20a is the projection of the nominal exit pupil onto the mask plane and FIG. 20c shows that part of MP (FIG. 20b) that is within the nominal system exit pupil (WPIm) and would print if the effective source were had constant luminous intensity across the exit pupil. Variations in the luminous intensity will produce variations in the CD of the individual lines printed. FIG. 20d illustrates the CD for a portion of the FIG. 20c. FIG. 20e is a calibration curve from which our measured CD measurements can be correlated with an intensity. The result of making an array of CD measurements and correlating them through a calibration curve is a map of the luminous intensity (energy per unit solid angle) of the effective source.

The procedure for establishing calibration curve of FIG. 20e is briefly:
 1) Set illumination to minimum sigma or partial coherence.
 2) Pick CD measurement site (from amongst choices of FIG. 20b) located at approximately the maxima of illumination pattern set in 1.
 3) Perform a dose array.
 4) Measure the CD at site chosen in 2 to get calibration curve.

Note, this is a relative calibration curve. Using it we can get the luminous intensity (energy per unit solid angle) map to within an overall scale factor. Overall scale factor is equivalent to dose which is routinely calibrated anyway.

FIGS. 21a–f illustrate the use of this technique. FIG. 21a outlines the effective source ES1 (in this case a disc) and it's relation to entrance pupil EP. The effective source luminous intensity along line A–A' is shown in FIG. 21b. q denotes the source angle. Pattern MP (FIG. 21c) in the object plane sits above opening MP' (FIG. 21f) and when illuminated by the effective source produces the pattern schematically shown by FIG. 21d. Clear areas indicate exposed and developed resist. The CD measurements made along line AA' (FIG. 21d) are made at the intersection of AA' with L1 . . . L11 respectively and give measurements CD1 . . . CD11 respectively. Using the calibration curve of FIG. 20e, we back out relative values J1, . . . J11 of the effective source luminous intensity. These are plotted and the circles in FIG. 21e since the locations of the CD measurements are also known. The resulting dashed curve CI1 is along with the true solid curve CC1.

Other Arrangements

Figure 27:
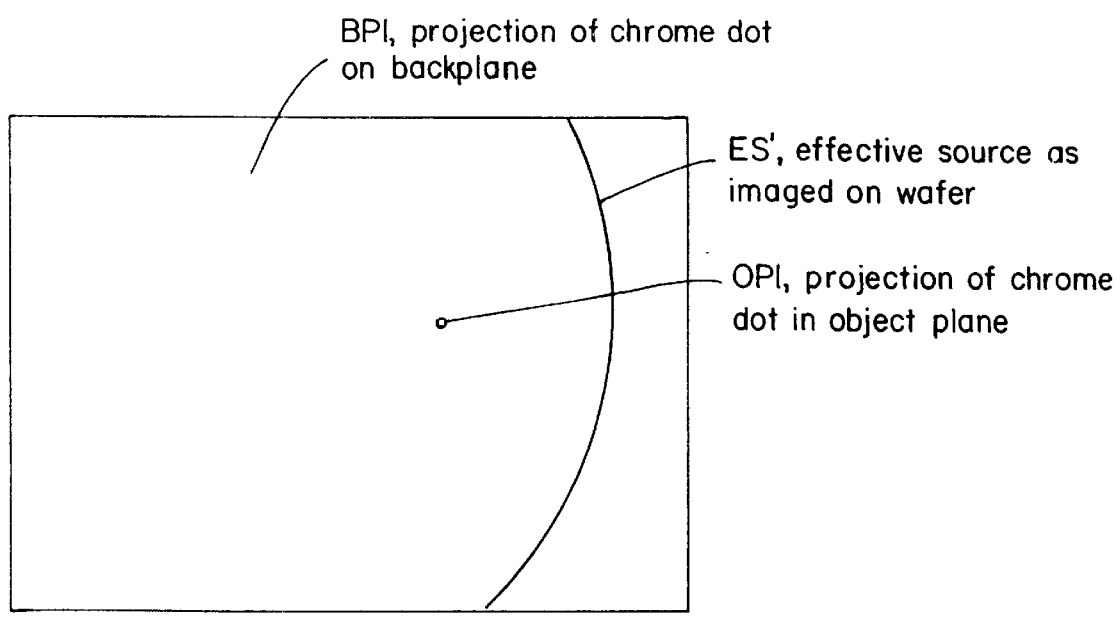
FIG. 27 is a photoresist pattern using openings or obstructions simultaneously in the backplane, object plane and aperture plane.

An alternative technique for assessing effective source centration is illustrated in FIG. 27. There, effective source ES' as imaged by a pinhole camera to the wafer plane is shown. It's centration relative to the exit pupil can be judged by it's position relative to mark OP1 or mark BP1. Mark OP1 results from a dot or obscuration present in the object plane OP. The offset of OP1 relative to it's nominal position within ES' is a direct measure of effective source centration. In addition to OP1 is a mark BP1 (FIG. 27) that is due to a feature placed on the backplane BP (FIG. 24) of reticle R. This feature can be used instead of feature OP1 to ascertain effective source centration.

In general, backplane BP can be used for additional structures either in place of or as an adjunct to structures in the aperture plate APL (FIG. 24). In particular, all of the previously described aperture plate structures (with slight modification) could be placed on backplane BP and the result would perform substantially the same. All 3 planes BP, OP and AP can be used together as in FIG. 27 for effective source diagnosis.

The following describes a direct technique for determining $\sigma$, the partial coherence. Once the condenser has been adjusted so the effective source is centered on the exit pupil, an exposure through a series of object plane obstructions of different diameters is made. A set of object plane openings having centered circular obstructions of successively increasing diameters and each has a corresponding aperture plate opening. The effect of the circular obscuration is to cover a corresponding central portion of the effective source image leaving only a circular ring. The circular ring width and the known diameter of the circular obscuration allow the source diameter to be ascertained from a single CD measurement. By using an array of different diameter obscurations, multiple measurements of $\sigma$ can be made. This arrangement can be implemented as a cluster of nearby pinholes (each with a different diameter object plane obstruction), the pinholes being near enough together that any variation in the effective source can be ignored. Alternatively, separate reticle/aperture plane units, each unit having a different object plane obstruction diameter could be used.

Another technique for visually quantifying source size, shape and position is shown in FIGS. 25 and 26. Calibration pattern GR1 (FIG. 25a) resides in the object plane and is offset from patterns used for field point specific diagnosis. Thus in FIG. 22b, calibration pattern GR1 is located so it can be bladed off (not exposed) while field point specific patterns G1 . . . G100 are exposed. Calibration pattern GR1 is then stepped over to a pinhole camera exposure and itself exposed, the result being a pinhole camera image surrounded by a reference pattern of known size, orientation, and placement. In more detail, the following steps are carried out:
 1) Expose one or more field specific patterns G1–G100. For illustration subpattern PC1 (FIG. 22a) and corresponding opening PC1' (FIG. 23a) are considered. This technique applies to any of the other patterns. The resulting pattern in exposed photoresist for an unobscured aperture stop and and annular source is AN10 of FIG. 25b. Shaded regions indicate exposed photoresist.
 2) Step the exposed wafer so AN10 is nominally centered underneath the projected image of calibration pattern GR1 of FIG. 25a. FIG. 25a is the object plane pattern. Shaded regions are chrome.
 3) Aperture down on calibration pattern GR1 and expose. The resulting exposure pattern is shown in FIG. 25c. Shaded areas indicate exposed photoresist. Having the transverse scale of GR1 in integer units of $\tan(\theta)/\tan(\theta_{NA})$ allows for direct read off of angular size and centering. In the above:
    $\theta$=angle of the effective source relative to chief ray
    $\theta_{na}$=arcsin(NA), NA=numerical aperture of imaging objective.

A calibration pattern set useful for $\sigma$ measurement consists of a set of opaque rings of varying diameter. Choosing a ring slightly larger than the stepper $\sigma$ setting and printing it over the projected pinhole image, would provide a quick and accurate check on a as a function of field position.

Other calibration patterns such as that shown in FIG. 26 could also be used. Since different effective source configurations (conventional, annular, quadrupole, etc.) and different measurements (centration, diameter, x/y width, asymmetry) are best done with different calibration patterns, numerous patterns (other than GR1) could be arrayed in object plane OP (FIG. 22b) and used under the most favorable circumstances. Alternatively, instead of stepping around calibration pattern GR1, a separate reticle consisting of an array of calibration patterns (of which GR1 or GR2 are examples), one for each group G1 . . . G100, could be loaded in and printed. The resulting exposed wafer and information gleaned would be practically identical.

Since an exposure at only a single z plane is necessary for the operation of this invention, variations of this technique can utilize electrical methods such as the van der Pauw resistors to ascertain source centration. Another electrical technique would utilize resistance measurements to obtain the CD map and thereby infer the effective source luminous intensity.

For purposes of illustration the diagrams, descriptions and equations have be restricted to an image and object side telecentric system. This device and it's technique of use can be easily modified by those skilled in the art to include imaging systems nontelecentric on object, image or on both object and image sides.

Also, the photoresist systems used to illustrate this invention have been of the positive type. Negative type photoresists could equally well be used.

This device has been described with respect to imaging systems utilizing transmissive object plane masks. It could be readily adapted for use is systems using reflective object plane masks such as the short wavelength ($\lambda \sim 10$–20 nm) X ray systems proposed in refs. 62+63. In such a system, the aperture plate could be placed in a pellicle plane if additional openings were provided to allow for unobstructed illumination by the effective source of the region of interest in the object plane. Then, providing the distance from the object plane mask surface were large enough, an appropriately placed aperture hole could be used. The roles could be reversed, light being first incident on an aperture hole, then mask, then large unobstructed opening in the aperture plate. Other arrangements where the aperture plate and/or backplane apertures are placed at locations where this dual use is not required is also possible. For instance, placing the aperture plate at a location where it does not obstruct light illuminating the object plane mask would produce a workable SMI.

What has been said above for reflective mask systems also applies to transmissive mask systems. The aperture plane or backplane need not be located at within the pellicle envelope or physically attached to the object plane mask. They can be separately inserted at appropriate locations in the imaging objective or condenser beamtrain if the manufacturer has made provision for such a plate.

The use of this device has been described in reference to it's use in projection photoexposure systems. Such photoexposure systems can take the form of refractive or catadioptric, fixed field step and repeat systems, slit type scanning systems, or scanning step and repeat systems. However it can equally well be used for other instruments such as projection ablation tools, scanning imaging or ablation systems, 9, 13, for cameras, microscopes and most conveniently in any instrument having a readily useable recording plane. Additionally, using backplane architecture (there will generally be no room for an aperture plate between object and image plane) contact printer and proximity printer system can also have their effective sources diagnosed.

What is claimed is:

1. A process of measuring the effective source of an projection image system having an effective source, an object plane, an imaging objective, an exit pupil, and an image plane, the process comprising the steps of:

providing an array of field points on an object plane of the projection imaging system;

providing a media at the image plane for receiving images;

providing a corresponding array of aperture plane apertures displaced from the object plane a sufficient distance to image the effective source, the array of corresponding object plane apertures corresponding to the field points on the object plane;

projecting images of the effective source through the corresponding array of aperture plane apertures to produce on the media at the image plane effective source images; and measuring the images of the effective source on the media to determine the effective source.

2. A process of measuring the effective source of projection image system according to claim 1 and including the further step of:

printing on the media at the image plane a corresponding array of fudicials, the corresponding array of fudicials corresponding to the array of field points on the object plane to be measured.

3. A process of measuring the effective source of an projection imaging system according to claim 2 and including the further step of:

measuring displacement of the effective source images at the image plane on the media relative to the fudicials to measure centration of the effective source relative to the exit pupil and projecting lens train for the array of field points.

4. A process of measuring the effective source of an projection imaging system according to claim 1 and including the futher step of:

measuring relative intensity of the images on the media to determine luminous intensity for the array of field points.

5. A process of measuring the effective source of an projecting imaging system according to claim 4 and including the further step of:

the measuring relative intensity step includes:
projecting a matrix of lines; and,
measuring the line width to determine relative luminous intensity for the array of field points.

6. A process of measuring the effective source of an projection imaging system according to claim 1 and including the further step of:

measuring the relative size of the images on the media to determine the partial coherence for the array of field points.

7. A process of measuring the effective source of an projection imaging system according to claim 1 and including the further step of:

placing a patterned reticle at the image plane.

8. A process of measuring the effective source of an projection imaging system according to claim 1 and including the further step of:

placing a recording media at the image plane.

9. A process of measuring the effective source of an projection imaging system according to claim 8 and including the further step of:

the recording media is positive photoresist.

10. A process of measuring the effective source of an projection imaging system according to claim 9 and including the further step of:

the recording media is negative photoresist.

11. In a projection image system having a effective source, an object plane, a reticle pellicle envelope at the object plane, a imaging objective, an exit pupil, and an image plane, the improvement for placement within reticle pellicle envelope at the object plane for measuring the effective source at the image plane comprising:

a device for placement at the object plane of the projection image system, the device including:

a mounting for an aperture plate for insertion into the reticle pellicle envelope;

an aperture plate to image the effective source using aperture plate apertures, each aperture plate aperture for imaging a discrete image of the effective source to the image plane; and, an attachment for attaching the aperture plate to the mounting to maintain the aperture plate displaced a sufficient distance from the object plane to image the effective source through each aperture on the image plane.

12. The device of claim 11 and wherein:

the aperture plate has pin hole size openings.

13. The device of claim 11 and wherein:

the mounting has an open clear area.

14. The device of claim 11 and wherein:

the reticle acts in transmission to the effective source.

15. The device of claim 11 and wherein:

the reticle acts in reflection to the effective source.

16. The device of claim 11 and wherein:

the aperture plate is located between the effective source and object plane.

17. The device of claim 11 and wherein:

the aperture plate is located between the effective source and image plane.

18. The device of claim 11 and wherein:

the aperture plate and mounting are permanently attached one to another.

19. The device of claim 11 and wherein:

the aperture plate and mounting are removably attached one to another.

20. The device of claim 11 and wherein:

the aperture plate and mounting separately mount to the reticle pellicle envelope.

21. The device of claim 11 and wherein:

the projection imaging system is a projection lithography tool.

22. The device of claim 11 and wherein:

the projection imaging system is an ablation tool.

* * * * *